United States Patent [19]
Kim

[11] Patent Number: 5,723,884
[45] Date of Patent: Mar. 3, 1998

[54] CHARGE COUPLED DEVICE IMAGE SENSOR HAVING OPTICAL SHIELDING METAL

[75] Inventor: Yong Kwan Kim, Kyunkgi-do, Rep. of Korea

[73] Assignee: LG Semicon Co., Ltd., Seoul, Rep. of Korea

[21] Appl. No.: 274,951

[22] Filed: Jul. 14, 1994

[30] Foreign Application Priority Data

May 21, 1994 [KR] Rep. of Korea ............... 11096/1994

[51] Int. Cl.$^6$ ................. H01L 27/148; H01L 29/768
[52] U.S. Cl. ................. 257/232; 257/233; 257/250; 257/435
[58] Field of Search ................. 257/232, 233, 257/250, 435

[56] References Cited

U.S. PATENT DOCUMENTS

| | | | |
|---|---|---|---|
| 5,210,433 | 5/1993 | Ohsawa et al. | 257/233 |
| 5,286,990 | 2/1994 | Hynecek | 257/233 |
| 5,399,888 | 3/1995 | Nakashiba | 257/233 |

OTHER PUBLICATIONS

Article entitled "A 2 Million Pixel FIT–CCD Image Sensor For HDTV Camera Systems" By M. Yamagishi, et al., Published in *IEEE Transactions on Electron Devices*, vol. 38, No.5, May 1991.

*Primary Examiner*—Ngân V. Ngô
*Attorney, Agent, or Firm*—Morgan, Lewis and Bockius LLP

[57] ABSTRACT

A charge coupled device (CCD) image sensor and more particularly a wiring of charge transfer electrodes of a CCD image sensor which is made suitable for improving the charge transfer efficiency of vertical charge coupled devices (VCCDs) thereof. The CCD image sensor includes: a plurality of photoelectric conversion regions for converting light incident to a semiconductor substrate into image signal charges; a plurality of VCCD regions for transmitting image signal charges generated in the plurality of photoelectric conversion regions in a vertical direction; a plurality of transfer gate electrodes for transmitting the image signal charges generated in the plurality of photoelectric conversion regions in four phases in the vertical direction; an insulation film for insulating the plurality of transfer gate electrodes; first metal layers formed over the plurality of photoelectric conversion regions and the plurality of VCCD regions for intercepting light; and a second metal layer formed over the plurality of VCCD regions for connecting between transfer gate electrodes the same clock signals applied thereto within one VCCD and shielding light incident to the VCCD region.

1 Claim, 11 Drawing Sheets

5,723,884

CHARGE COUPLED DEVICE IMAGE SENSOR HAVING OPTICAL SHIELDING METAL

FIELD OF THE INVENTION

This invention relates to a CCD image sensor and a fabrication method for a CCD (Charge Coupled Device) image sensor, more particularly to a wiring of charge transfer electrodes of a CCD image sensor which is made suitable for improving charge transfer efficiency of vertical charge coupled devices (VCCDs) thereof.

BACKGROUND OF THE INVENTION

In general, in methods for scanning signals using scanning devices, such as CCD, there are interlace method and non-interlace method.

Of the methods, the non-interlace method is a method that a frame divided into a plurality of fields is scanned in the order of reception of filed data, and the interlace method is a method that a frame is divided into even fields and odd fields, which fields are scanned by corresponding even field data and odd field data, alternatively, scanned by the odd field data first, followed by even field data according to the order of reception of the field data.

Therefore, the non-interlace method is used in military equipment such as missile because the speed of scanning of the non-interlace method is fast, which allows to catch an image of an object moving fast quickly, whereas the interlace method is mostly used in scanning of a TV picture frame of NTSC method or PAL method because the speed of scanning of the interlace method is slow, providing a sense of stability of the picture.

A general CCD image sensor according to the foregoing interlace method is an image sensing element generating video signals, including, as shown in FIG. 1, a plurality of photo diode regions arranged in an array in a form of matrix with a fixed distance between them on a semiconductor substrate such as silicon, generating image signal charges by converting photo signals into electrical signals, a plurality of vertical charge coupled device (VCCD) regions each formed between the photo diode regions in vertical direction for transmitting the image signal charges generated in the photo diode regions in vertical direction, a horizontal charge coupled device region formed below the VCCD regions in horizontal direction for transmitting the image signal charges in horizontal direction transmitted from the VCCD regions in vertical direction, and a sensing amplifier for sensing the image signal charges transmitted from the HCCD region.

The photo diode regions and the VCCD regions of a conventional CCD image sensor is explained hereinafter, referring to the attached drawings.

Shown in FIG. 2 is a layout of transfer gates of a conventional CCD image sensor, shown in FIG. 3 is a plan view of a metal wiring and an optical shielding layer of a conventional CCD image sensor, and shown in FIG. 4 is a section across line I—I of FIG. 3, wherein the image signal charge accumulated in the photo diodes (PD) is transmitted to the VCCD regions, and a plurality of transfer gates $PG_1$ to $PG_4$ are formed on the VCCD regions for transmitting the image signal charge from the VCCD regions vertically.

Herein, there are two transfer gates TG which are provided for transmitting the image signal charge accumulated in the photo diodes to the VCCD regions, corresponding to each frame having two field.

That is, a first transfer gate $TG_1$ is a transfer gate for transmitting the signal charge of the photo diodes PD1 arranged at odd numberth counted in vertical direction within the odd fields, i.e., arranged at odd numberth HCCD lines, to VCCD region, and a second transfer gate $TG_2$ is a transfer gate for transmitting the signal charge of the photo diodes $PD_2$ arranged within the even fields counted in vertical direction, ie., arranged in even numberth HCCD lines, to VCCD regions.

The first transfer gate $TG_1$ is connected to the first transfer gate electrode $PG_1$, and the second transfer gate $TG_2$ is connected to the third transfer gate electrode $PG_3$, wherein the image signal charges accumulated in the photo diodes PD are transmitted to VCCD region at the time of application of a trigger voltage of a VCCD clock signals $V\phi_1$ and $V\phi_3$ applied to the transfer gates $PG_1$ and $PG_3$, which is transmitted in four phases due to the clock signals $V\phi$, $V\phi_2$, $V\phi_3$ and $V\phi_4$.

The image signal charges transmitted to the VCCD region are provided of transmittal in vertical direction by the potential of the VCCD clock signals $V\phi_1$ to $V\phi_4$ applied to the transfer gate electrodes $PG_1$ to $PG_4$.

In the CCD image sensor described above, optical shielding metal (OSM) is formed over the VCCD regions, HCCD region and transfer gates as shown in FIGS. 3 and 4.

That is, since the photo diode regions should receive lights to generate image signal charges, and in order to make the HCCD region and the VCCD regions transmit only the image signal charges generated in the photo diode regions in order by way without the image signal charges mixed up with adjacent ones, lights should be shielded in all regions including the HCCD region and VCCD regions, the OSM is provided on all over the surface except the photo diode regions.

The operation of such a conventional CCD image sensor according to the interlace method is as follows.

Shown in FIG. 5(a) is tining of VCCD clock signals $V\phi_1$ to $V\phi_4$ for applying to the transfer gate electrodes $PG_1$ and $PG_2$, and shown in FIG. 5(b) are VCCD clock signals $V\phi_1$ to $V\phi_4$ within a unit section K of FIG. 5(a).

When light is incident to a photo diode PD, image signal charge is generated in the photo diode PD according to the intensity of light incident thereto, which generated image signal charge is transmitted to a VCCD region in response to the VCCD clock signals $V\phi_1$ to $V\phi_4$ applied to the transfer gate electrodes $PG_1$, $PG_2$, $PG_3$ and $PG_4$.

That is, the image signal charges of the odd fields are transmitted in response to the VCCD clock signals $V\phi_1$ and $V\phi_2$ applied to the transfer gate electrodes $PG_1$ and $PG_2$: on application of voltage $V_1$ at a high state to the first transfer gate $TG_1$, the signal charge generated in a photo diode $PD_1$ arranged on an odd numberth HCCD line is transmitted to a VCCD region.

On the other hand, the image signal charges of the even fields are transmitted in response to the VCCD clock signals $V\phi_3$ and $V\phi_4$ applied to the transfer gates $PG_3$ and $PG_4$: on application of voltage $V_2$ at a high state to the second transfer gate $TG_2$, the signal charges generated in the photo diode $PD_2$ arranged on an even numberth HCCD line are transmitted to the HCCD region.

The signal charges transmitted to the VCCD regions are, as shown in FIG. 5(b), transmitted to the HCCD region of the VCCD clock signal by the potential applied to the transfer gate electrodes $PG_1$ to $PG_4$, then transmitted to the sensing amplifier in response to the HCCD clock applied to the HCCD region, and finally transmitted to outside as information voltage by the sensing amplifier.

However, the foregoing conventional CCD image sensor according to the interlace method has following problems.

First, since the widths of transfer gate electrodes $PG_1$, $PG_2$, $PG_3$ and $PG_4$ to which the VCCD clock signals $V\phi_1$ to $V\phi_4$ are applied become narrower according to the developments of CCD image sensors to higher resolution and higher pixels (One million to two million pixels), the surface resistance of the transfer gate electrodes becomes greater.

Accordingly, clock frequency of fast VCCD clock signals $V\phi_1$ to $V\phi_4$ can not be transmitted quickly, lowering charge transfer efficiency of image signal charges resulting in bad resolution.

Second, since the widths of the transfer gate electrodes become narrower, there is possibility of breakage of lines, and once breakage should happen on the transfer gate electrodes, the image signal charges of the photo diodes having the line broken can not be transmitted, reducing the reliability.

The object of this invention designed for solving the foregoing problems, lies on improving charge transfer efficiency of image signal charges by reducing resistance of transfer gate electrodes even at high pixel density.

These and other objects and features of this invention can be achieved by providing a CCD image sensor including a plurality of photoelectric conversion regions for converting lights incident to a semiconductor substrate into image signal charges, a plurality of vertical charge coupled device regions for transmitting image signal charges generated in photoelectric conversion regions in vertical direction, a plurality of transfer gate electrodes for transmitting the image signal charges generated in the photoelectric conversion regions in four phases, an insulation film for isolating the transfer gate electrodes, first metal layers formed over regions excluding the photoelectric conversion regions and the vertical charge coupled device regions for shielding lights, and second metal layers formed over the vertical charge coupled devices for connecting between transfer gate electrodes having same clock signals applied thereto within same vertical charge coupled device and shielding lights incident to the vertical charge coupled device, and a method for fabricating a charge coupled device image sensor including processes for forming a plurality of photoelectric conversion regions and vertical charge coupled device regions by an selective ion injection of a second conduction type into first conduction type semiconductor substrate, forming a plurality of transfer gate electrodes for transmitting image signals in four phases over the vertical charge coupled regions after forming gate insulation film on all over the surface, forming optical shielding metal on all over the surface after depositing a first insulation film on all over the surface, forming a first metal layer by selective removal of the optical shielding metal of the photoelectric conversion regions and the vertical charge coupled device regions, forming contact holes for exposing transfer gate poles same clock signals applied thereto within same vertical charge coupled device region of the vertical charge coupled device regions of the vertical charge coupled device regions after depositing a second insulation film on all over the surface, and forming a second metal layer by depositing optical shielding and conductive metal on all over the surface and carrying out patterning leaving the optical shielding and conductive metal only over the vertical charge coupled device regions.

DETAILED DESCRIPTION OF THE INVENTION

The detail of this invention is to be explained hereinafter, referring to attached drawings.

Figure 1:
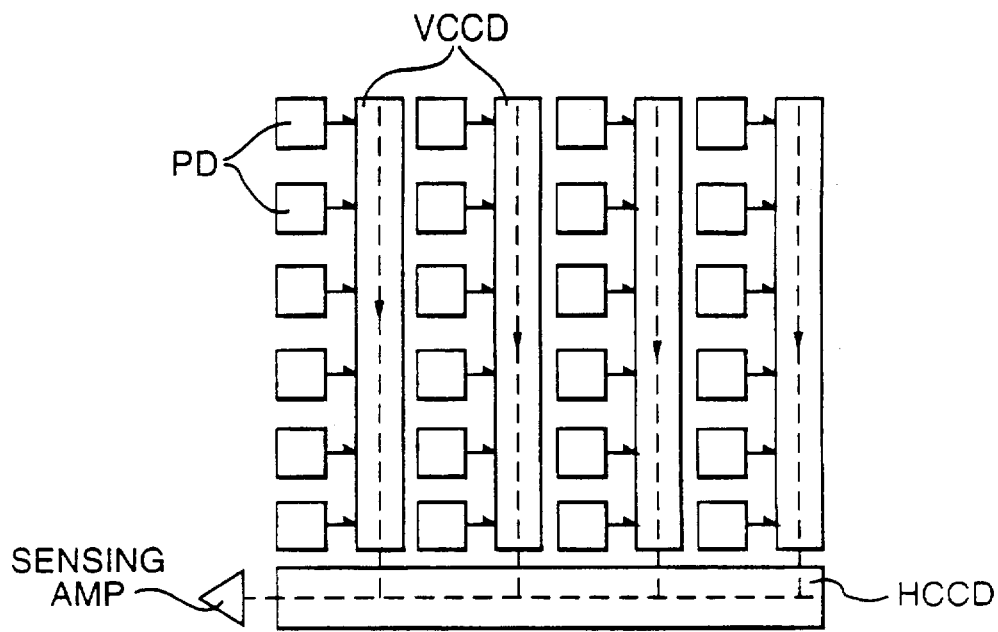
FIG. 1 is a layout of a conventional charge coupled device image sensor.
Figure 2:
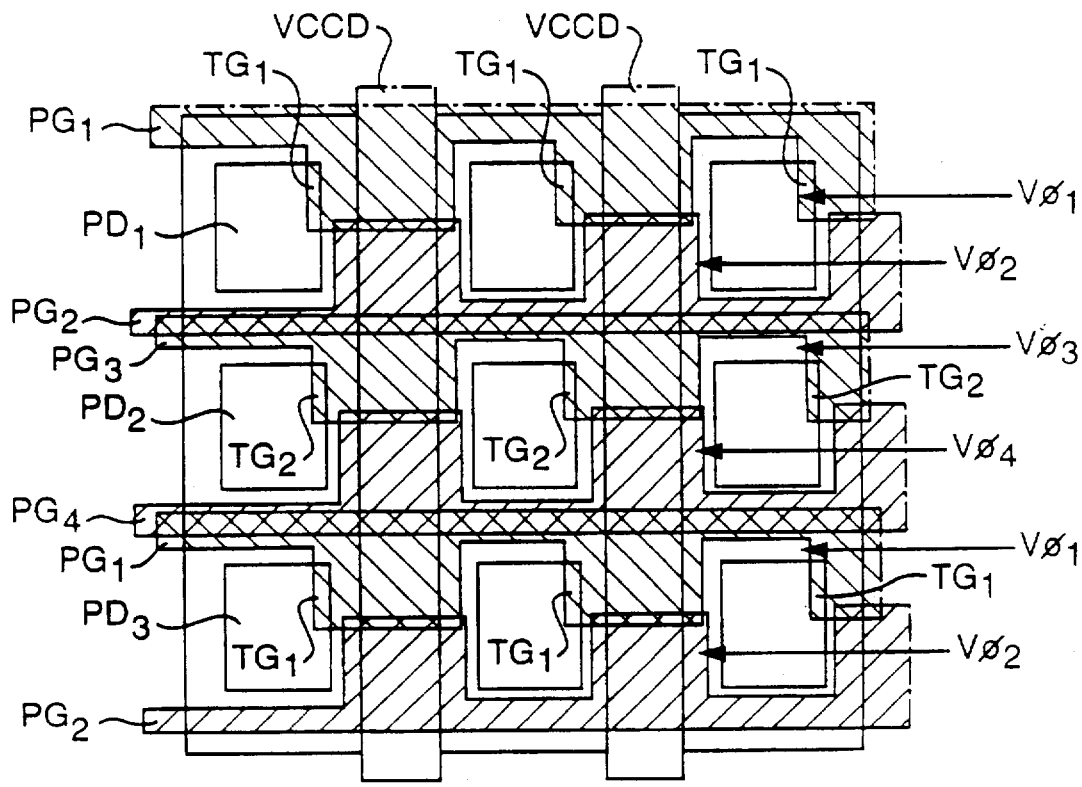
FIG. 2 is a layout of transfer gate electrodes of a conventional charge coupled device image sensor.
Figure 3:
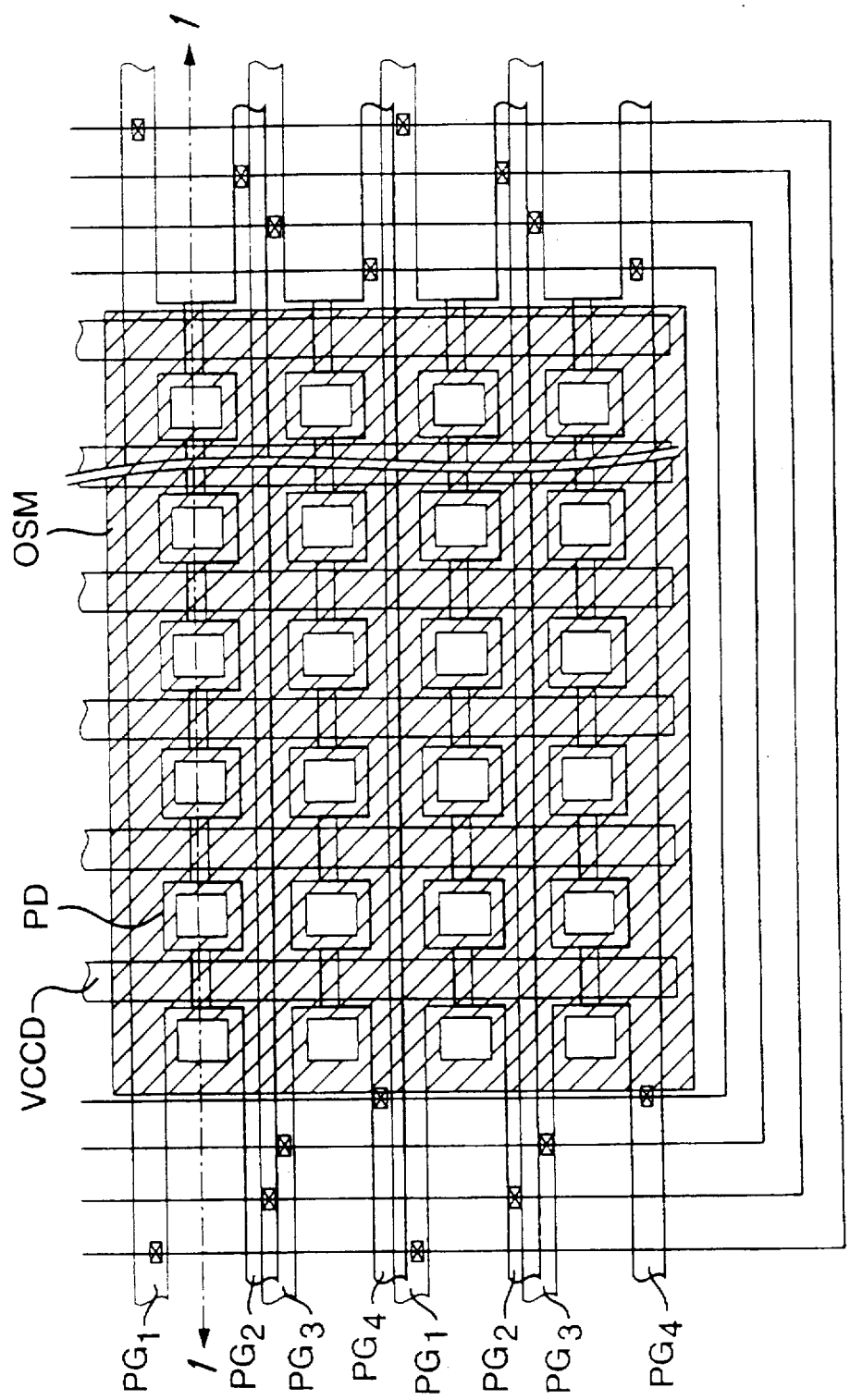
FIG. 3 is a layout of optical shielding metal of a conventional charge coupled device image sensor.
Figure 4:
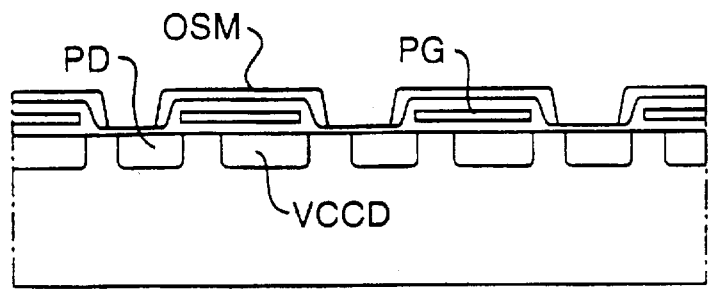
FIG. 4 is a section across line I—I of FIG. 3.
Figure 5A:
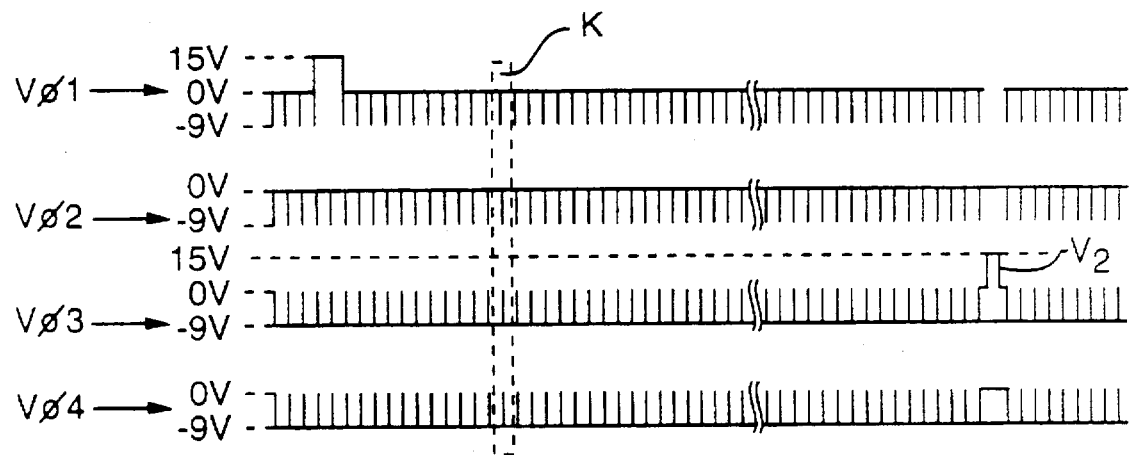
FIG. 5(a) shows timing of vertical charge coupled device clock signals $V\phi_1$ to $V\phi_4$ applied to transfer gate electrodes.
Figure 5B:
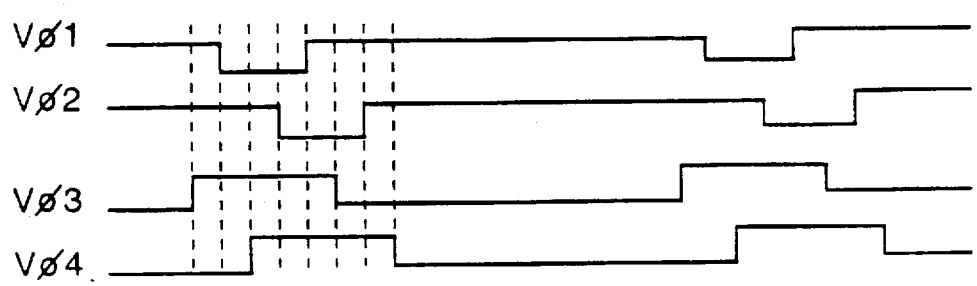
FIG. 5(b) shows timing of vertical charge coupled device clock signals $V\phi_1$ to $V\phi_4$ within a unit section K of FIG. 5(a).
Figure 6:
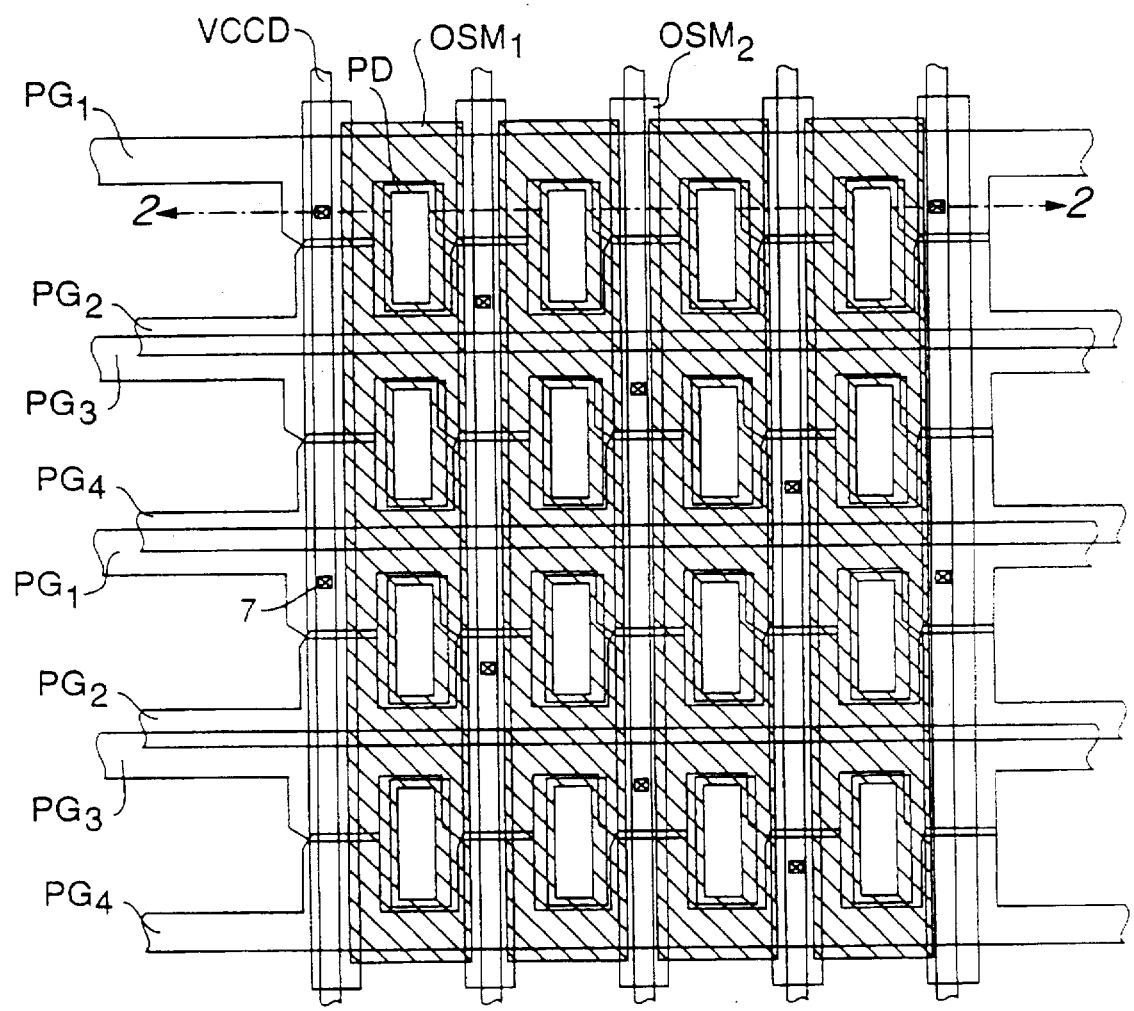
FIG. 6 is a layout of transfer gate electrodes and optical shielding metal of a charge coupled device image sensor in accordance with this invention.

FIG. 6 is a layout of transfer gate electrodes and optical shielding metal of a charge coupled device image sensor in accordance with this invention including photo diode regions PD arranged in a form of matrix on a semiconductor substrate generating image signal charges by converting photo signals into electric signals, vertical charge coupled device regions each formed between the photo diode regions in vertical direction for transmitting image signal charges generated in the photo diode regions PD in vertical direction, a horizontal charge coupled device region (not shown in FIG. 6) formed in lower side of the vertical charge coupled device regions horizontally for transmitting the image signal charges transmitted from the vertical charge coupled device regions in horizontal direction, and a sensing amplifier (not shown).

On the semiconductor substrate formed as the foregoing, a plurality of first, second, third and fourth transfer gate electrodes $PG_1$ to $PG_4$ are formed repeatedly for transmitting the image signal charges accumulated in the photo diode regions PD to the VCCD regions, and from which VCCD regions in vertical direction.

Similarly, transfer gates $TG_1$ and $TG_2$ for transmitting the image signal charges accumulated in the photo diode regions PD to the VCCD regions has two transfer gates $TG_1$ and $TG_2$ corresponding to each frame having two fields.

That is, the first transfer gate electrode $PG_1$ and the third transfer gate electrode $PG_3$ have transfer gates $TG_1$ and $TG_2$ formed thereon for transmitting the image signal charges accumulated in the photo diode regions to the VCCD regions.

And, a plurality of first metals $OSM_1$ are formed over regions excluding the photo diodes and transfer gate electrodes $PG_1$ to $PG_4$ for shielding lights, and second metals $OSM_2$ connect between transfer gates having the same clock signals applied thereto of the transfer gates $PG_1$ to $PG_4$ formed repeatedly.

Herein, the second metals $OSM_2$ are formed over each of the VCCD regions between the first metals $OSM_1$, with which layout the first, and the second metals $OSM_1$ and $OSM_2$ can shield lights incident to parts except the photo diode regions.

A method for fabricating a charge coupled device image sensor described above is to be described hereinafter.

FIG. 7(a) to 7(f) are sections showing fabricating process of a charge coupled device image sensor in accordance with the first embodiment of this invention, and FIG. 8(a) to 8(d) are perspective views showing fabricating processes of charge coupled device image sensor in accordance with the first embodiment of this invention, wherein FIG. 7(a) to 7(f) are sections across line II—II of FIG. 6.

Figure 7A:
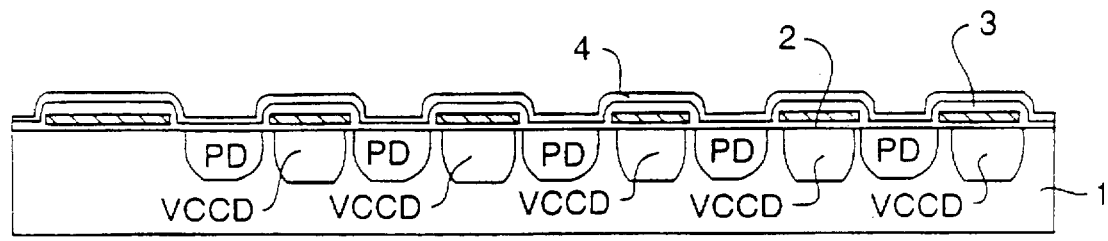
FIGS. 7(a) to 7(f) are sections showing fabricating processes of a charge coupled device image sensor in accordance with a first embodiment of this invention.
Figure 8A:
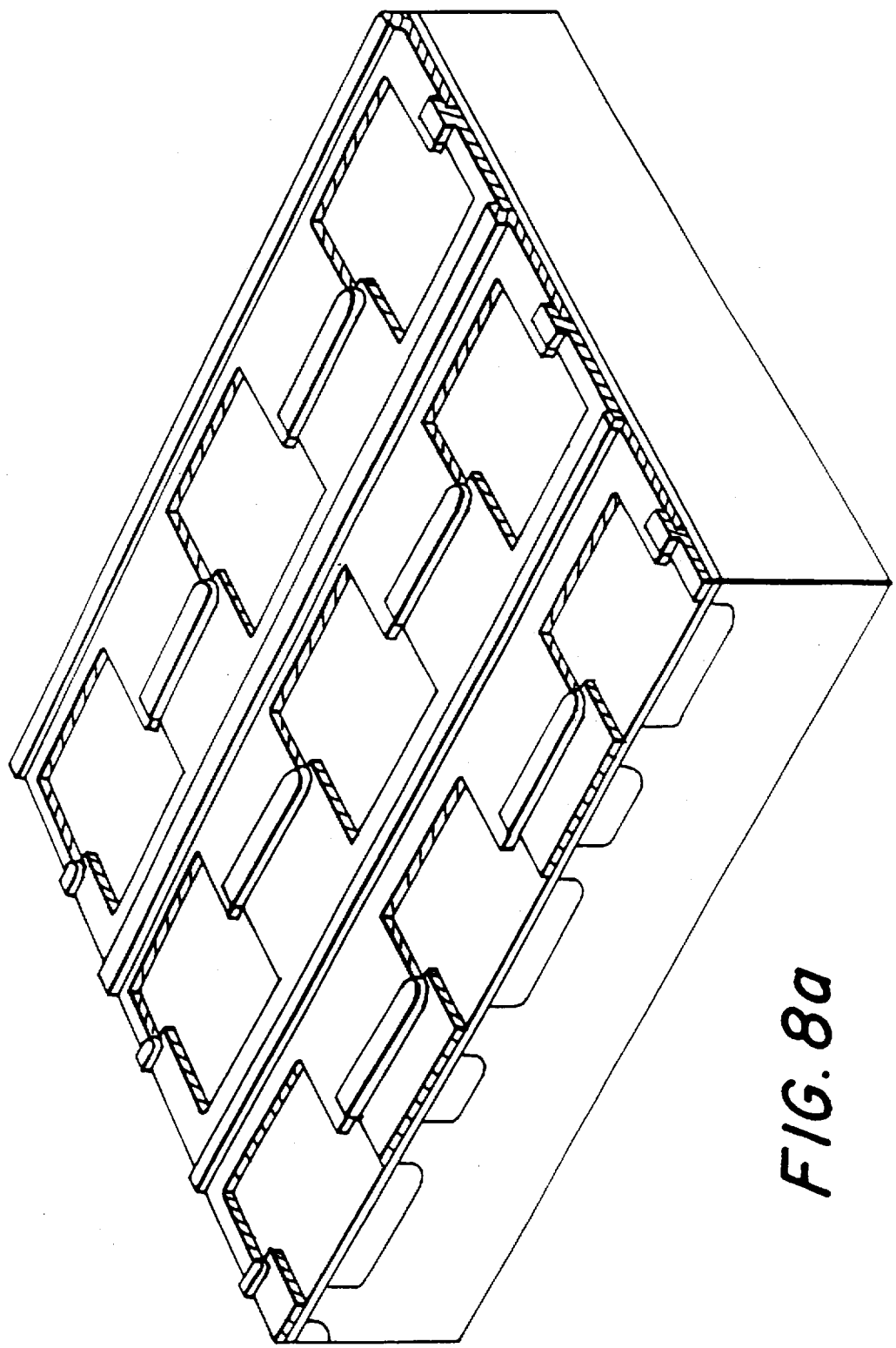
FIG. 8(a) to 8(d) are perspective views showing fabricating processes of a charge coupled device image sensor in accordance with the first embodiment of this invention.

As shown in FIGS. 7(a) and 8(a), the photo diode regions PD and VCCD regions are formed with a selective n type impurity ion injection process on a p type semiconductor substrate 1, a gate insulation film 2 is deposited on all over the surface, a plurality of transfer gate electrodes $PG_1$, $PG_2$, $PG_3$ and $PG_4$ are formed on each of the VCCD regions, on all over the surface of which a first insulation film (low temperature oxidation film) 3 and a second insulation film (nitride film) 4 are formed successively. Herein, though it could not be shown on the drawings, each transfer gate electrodes $PG_1$, $PG_2$, $PG_3$ and $PG_4$ are isolated by insulation films. Such a arrangement is made by, after forming the first and the third transfer gate electrodes $PG_1$ and $PG_3$ through depositing conductive material, depositing an insulation film and subsequent forming of the second and the fourth transfer gate electrodes $PG_2$ and $PG_4$.

Figure 7B:
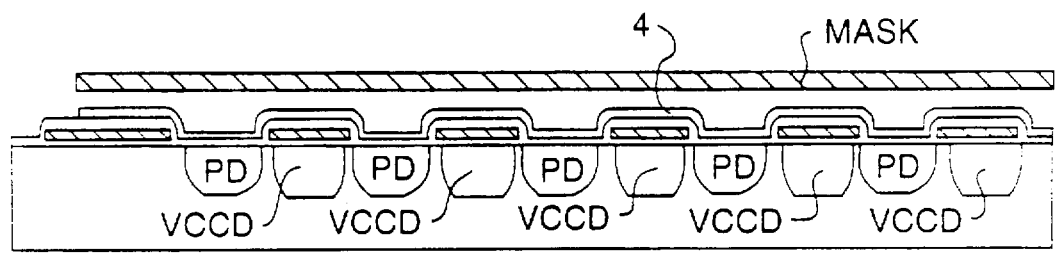
Figure 7C:
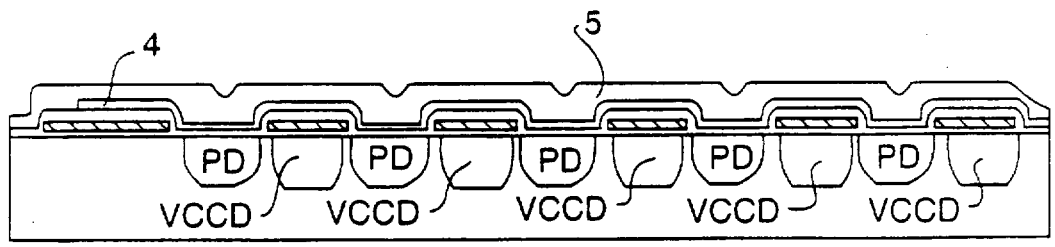

As shown in FIG. 7(b), the second insulation film 4 is removed selectively for the parts which are not pixel regions, and as shown in FIG. 7(c), a third insulation film 5 is deposited on all over the surface.

Figure 7D:
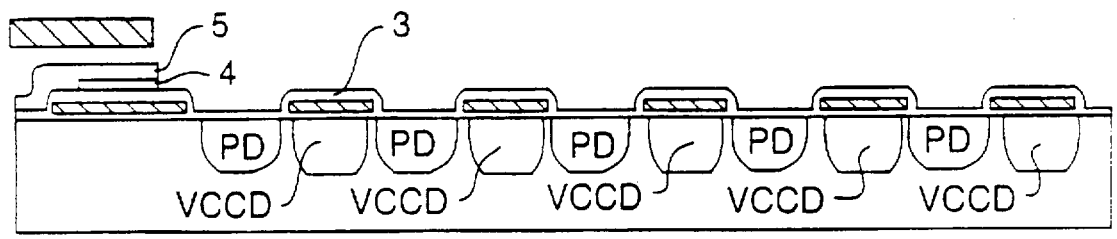

As shown in FIG. 7(d), the third insulation film 5 and the second insulation film 4 on the pixel regions (photo diode regions PD and VCCD regions), are removed selectively with a photo etching process.

Figure 7E:
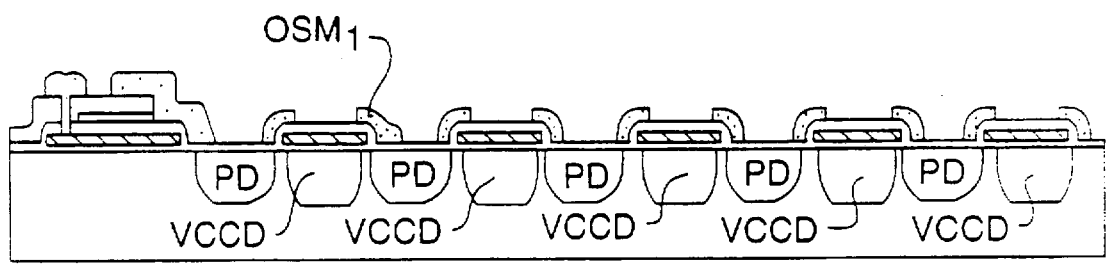
Figure 8B:
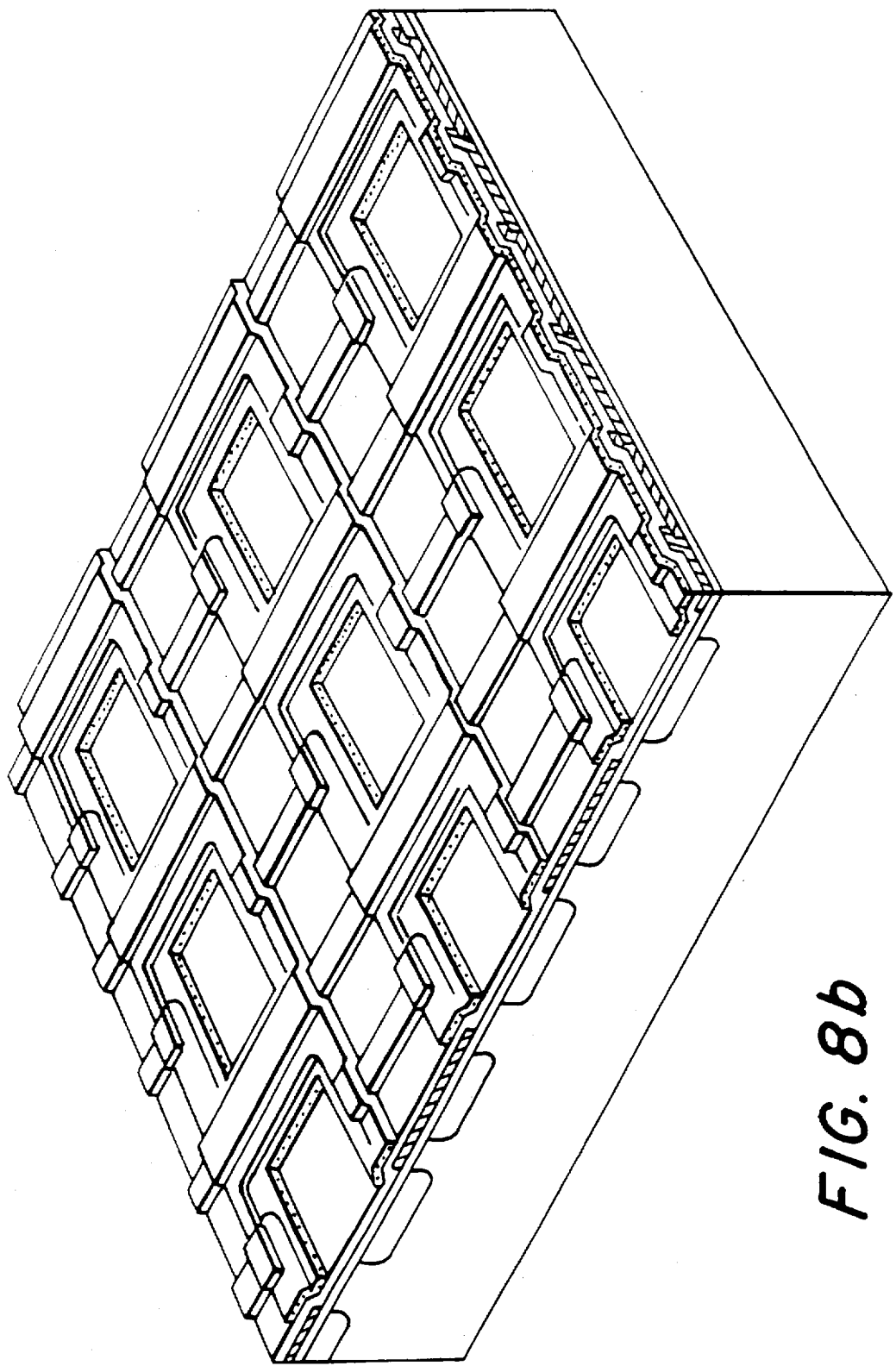

Then, as shown in FIGS. 7(e) and 8(b), optical shielding metal is deposited on all over the surface, of which the optical shielding metal over the photo diode region and the VCCD regions of the pixel regions are removed selectively, forming the first metals $OSM_1$. In this time, the first metals $OSM_1$ are made to overlap with the VCCD regions at the edges thereof when seen from above in regions between the VCCD regions and the photo diode regions.

Figure 7F:
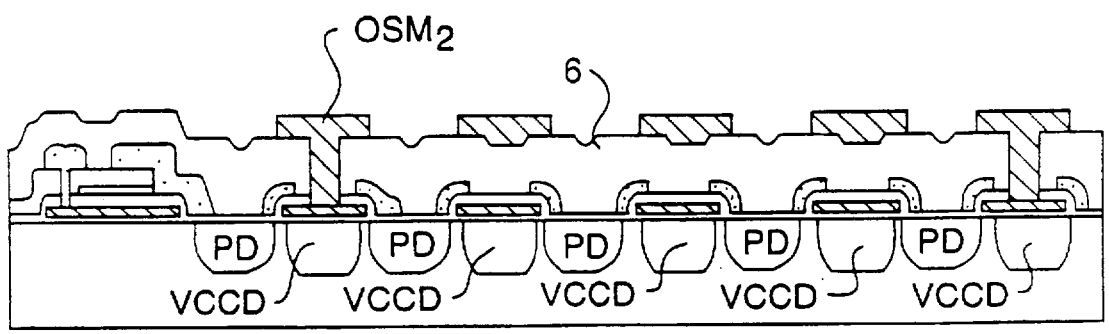
Figure 8C:
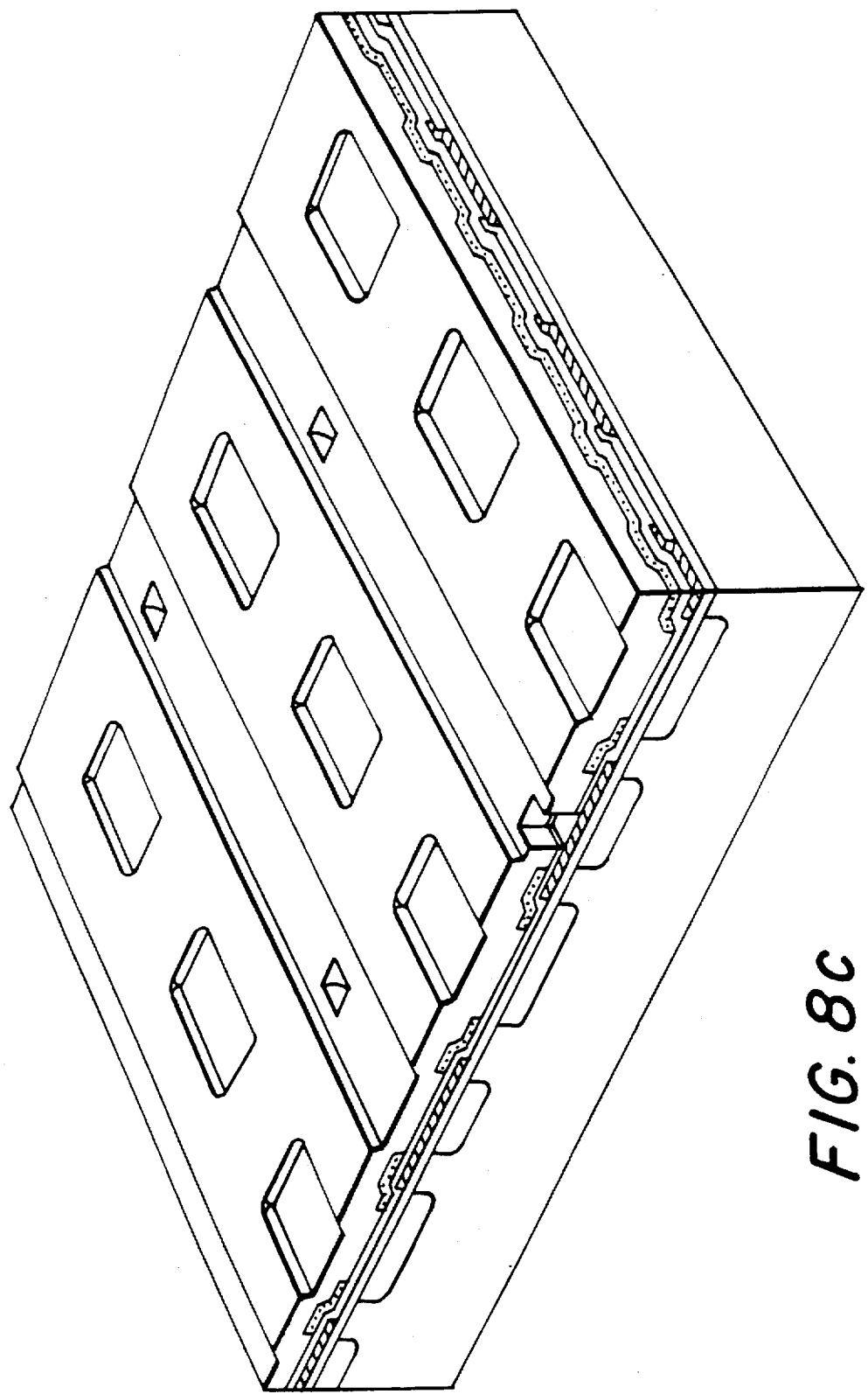

As shown in FIGS. 7(f) and 8(c), a transparent fourth insulation film 6 is deposited on all over the surface, and contact holes 7 are formed on transfer gate electrodes so that the same vertical VCCD clock signals are applied thereto within one VCCD region of the plurality of transfer gates $PG_1$, $PG_2$, $PG_3$ and $PG_4$ formed on each VCCD regions.

That is, of the VCCD regions, the contact holes are formed only on the transfer gate electrodes $PG_1$ the first VCCD clock signals $V\phi_1$ are applied thereto over the VCCD regions of 4n+1th (n=0, 1, 2, 3 ...) row, the contact holes are formed only on the transfer gate electrodes $PG_2$ the second VCCD clock signals $V\phi_2$ are applied thereto over the VCCD regions of 4n+2th row, the contact holes are formed only on the transfer gate electrodes $PG_3$ the third VCCD clock signals $V\phi_3$ are applied thereto over the VCCD regions pf 4n+3th row, and the contact holes are formed only on the transfer gate electrodes $PG_4$ the fourth VCCD clock signals $V\phi_4$ are applied thereto over the VCCD regions of 4nth row.

Figure 8D:
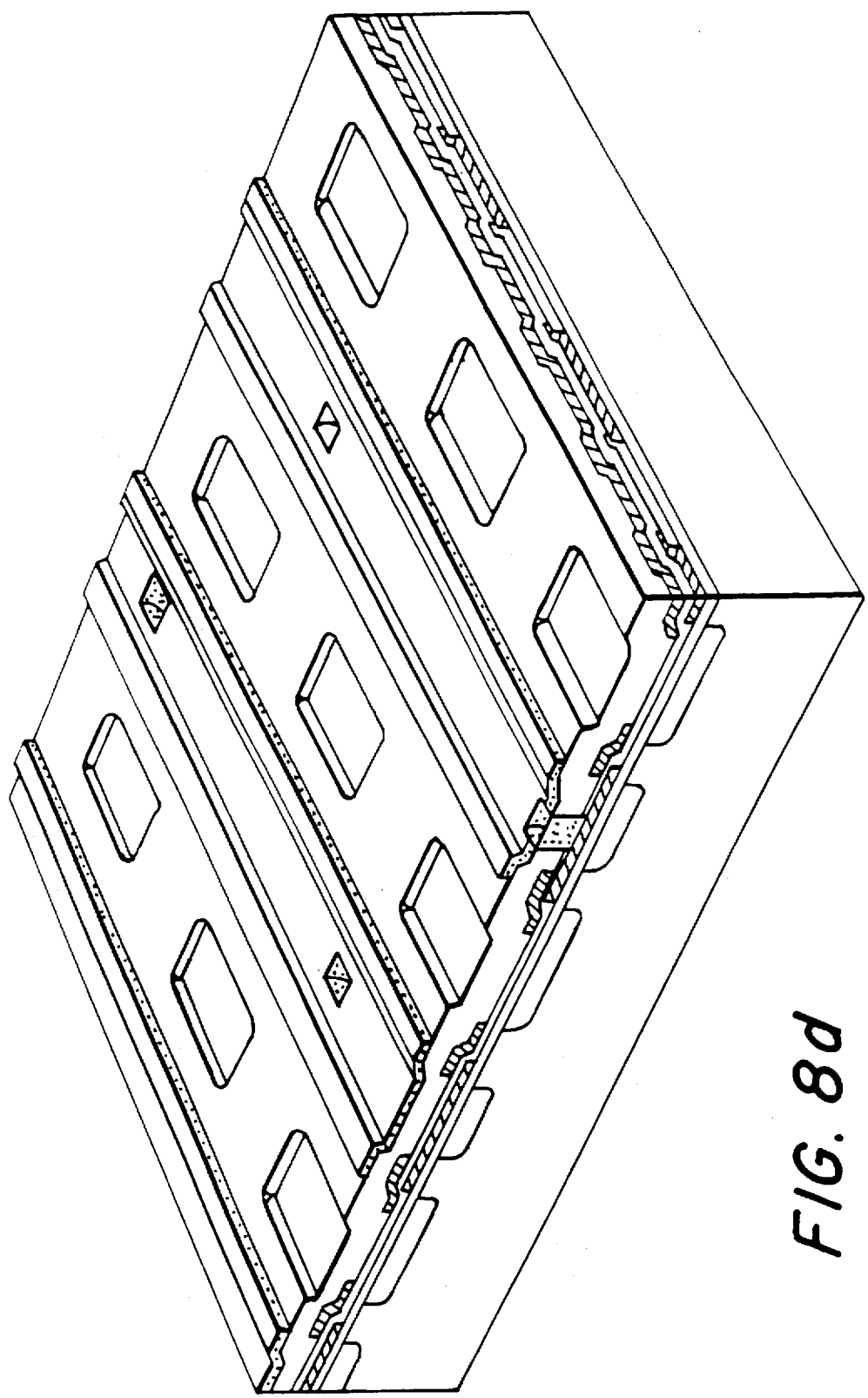

Then, as shown in FIG. 8(d), optical shielding and conductive metal is deposited on all over the surface, which is removed selectively leaving the metal only on the VCCD regions, carrying out patterning of the second metal layer $OSM_2$.

In this time, the second metal layer $OSM_2$ is made to connect the transfer gate electrodes with each other the same VCCD clock signal is applied thereto through the contact holes, and to overlap with the first metal layer $OSM_1$, allowing lights incident only to the photo diode regions selectively, excluding the VCCD regions.

Thereafter, though it has not been shown in the drawings, the fabrication of the CCD image sensor can be completed by forming microlenses on a flat layer, a color filter layer and the photo diode regions with conventional methods.

On the other hand, the method for fabricating a CCD image sensor in accordance with the second embodiment of this invention is to be explained hereinafter.

Figure 9A:
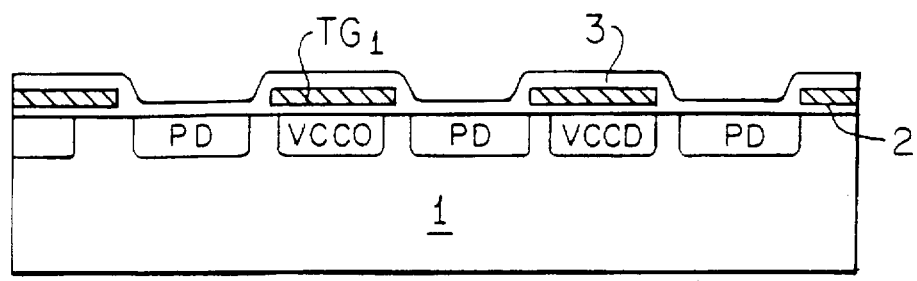
FIG. 9(a) to 9(d) are sections showing fabricating processes of a charge coupled device image sensor in accordance with a second embodiment of this invention.

FIGS. 9(a) to 9(d) are sections showing fabricating processes of a charge coupled device image sensor in accordance with the second embodiment of this invention wherein first, as shown in FIG. 9(a), photo diode regions PD and VCCD regions are formed with a selective n type impurity ion injection process into a p type semiconductor substrate 1, a gate insulation film 2 is deposited on all over the surface, a plurality of transfer gate electrodes $PG_1$ are formed over each VCCD regions and a first insulation film (low temperature oxidation film) 3 is form on all over the surface.

Figure 9B:
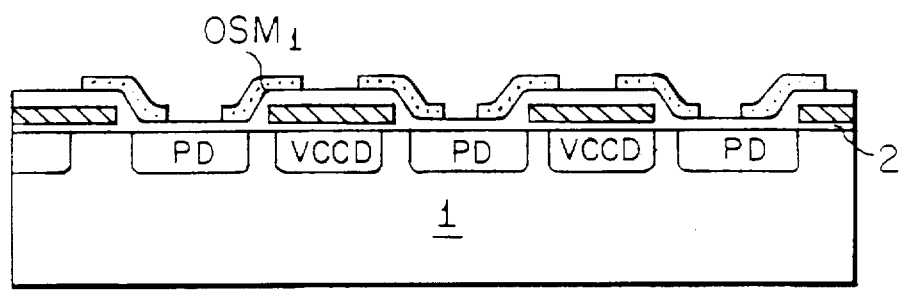

Then, as shown in FIG. 9(b), optical shielding metal is deposited on all over the surface, the optical shielding metal over the photo diode regions and the VCCD regions of pixel regions are removed selectively, forming first metals $OSM_1$. In this time, the first metals $OSM_1$ are made to overlap partly with the VCCD regions at the edges thereof when seen from above in regions between the VCCD regions and the photo diode regions.

Figure 9C:
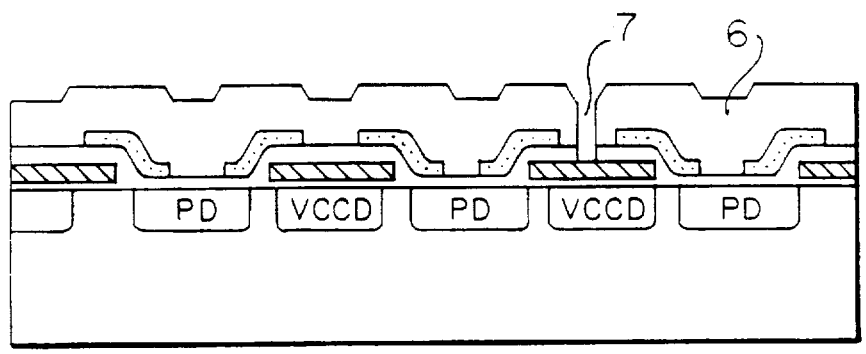
Figure 9D:
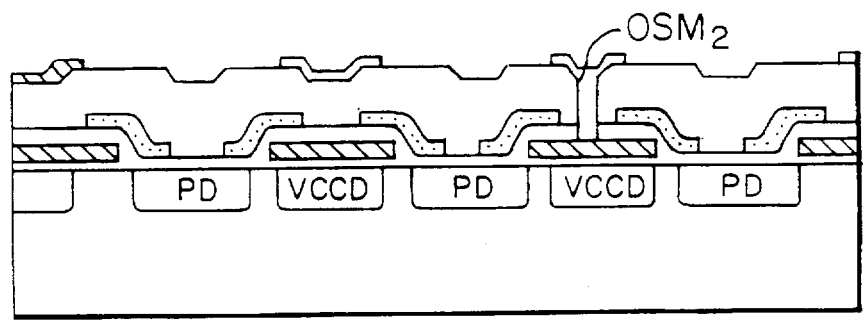

As shown in FIG. 9(c), a transparent fourth insulation film 6 is deposited on all over the surface, and contact holes 7 are formed on the transfer gate electrode so that the same vertical VCCD clock signals are applied thereto within one VCCD region of the plurality of transfer gate electrodes $PG_1$, $PG_2$, $PG_3$ and $PG_4$ formed on each VCCD region.

That is, of the VCCD regions the contact holes are formed only on the transfer gate electrodes $PG_1$ the first VCCD clock signals $V\phi_1$ are applied thereto over the VCCD regions of 4n+1th (n=0, 1, 2, 3 ...) row, the contact holes are formed only on the transfer gate electrodes $PG_2$ the second VCCD clock signals $V\phi_2$ are applied thereto over the VCCD regions of 4n+2th row, the contact holes are formed only on the transfer gate electrodes $PG_3$ the third VCCD clock signals $V\phi_3$ are applied thereto over the VCCD regions of 4n+3th row, and the contact holes are formed only on the transfer gate electrodes $PG_4$ the fourth VCCD clock signals $V\phi_4$ are applied thereto over the VCCD regions of 4nth row.

Then, as shown in FIG. 8(d), optical shielding and conductive metal is deposited on all over the surface, which is removed selectively leaving the metal only on the VCCD regions, carrying out patterning of the second metal layer $OSM_2$.

In this time, the second metal layer $OSM_2$ is made to connect the transfer gate electrodes with each other the same VCCD clock signal is applied thereto through the contact holes, and to overlap with the first metal layer $OSM_1$, allowing lights incident only to the photo diode regions selectively, excluding the VCCD regions.

Thereafter, though it has not been shown in the drawings, the fabrication of the CCD image sensor can be completed by forming microlenses on a flat layer, a color filter layer and the photo diode regions with conventional methods.

The operation of the CCD image sensor of this invention described above is, like the conventional CCD image sensor, lights incident to the photo diode regions is converted into electrical image signal charges, which charges are transmitted to the VCCD regions by the voltage $V_1$ at a high state of the first and the third VCCD clock signals applied from the transfer gate electrodes.

The image signal charges transmitted to the VCCD regions are transmitted to the HCCD region by the potential difference caused by the VCCD clock signals $V\phi_1$ to $V\phi_4$ which are transmitted to an output terminal thereof by the HCCD clock signals $H\phi_1$ and $H\phi_2$, and which are finally transmitted to outside by the sensing amplifier.

The CCD image sensor of this invention has following advantages.

It is possible to prevent surface resistance of transfer gate electrodes from increasing caused by narrower widths of the transfer gate electrodes when a CCD image sensor is made to have a high resolution and the consequential high prixel density (one million, two million pixels) because the transfer gate electrodes the same VCCD clock signals are applied thereto of the transfer gate electrodes, are connected to every 4nth row by the second metal layer which is provided for shielding lights incident to CCD regions.

Therefore, since the clock frequencies of the VCCD clock signals $V\phi_1$ to $V\phi_4$ can be transmitted quickly, whereby increasing charge transfer efficiency of image signal and improving the resolution.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A charge coupled device image sensor comprising:

a plurality of photoelectric conversion regions for converting lights incident to a semiconductor substrate into image signal charges;

a plurality of vertical charge coupled device regions for transmitting image signal charges generated in the plurality of photoelectric conversion regions in vertical direction;

a plurality of transfer gate electrodes for transmitting the image signal charges generated in the plurality of photoelectric conversion regions in four phases in vertical direction;

an insulation film for insulating the plurality of transfer gate electrodes;

first metal layers formed over regions excluding the plurality of photo electric conversion regions and the plurality of vertical charge coupled device regions for shielding lights; and, a second metal layer formed over the plurality of vertical charge coupled device regions for connecting between transfer gate electrodes the same clock signals applied thereto within one vertical charge coupled device and shielding lights incident to the vertical charge coupled device regions.

* * * * *